United States Patent
Okuno et al.

(10) Patent No.: US 6,455,892 B1
(45) Date of Patent: Sep. 24, 2002

(54) SILICON CARBIDE SEMICONDUCTOR DEVICE AND METHOD FOR MANUFACTURING THE SAME

(75) Inventors: Eiichi Okuno, Motosu-gun; Shinji Amano, Okazaki, both of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/663,134

(22) Filed: Sep. 15, 2000

(30) Foreign Application Priority Data

Sep. 21, 1999 (JP) .......................................... 11-267529

(51) Int. Cl.$^7$ ...................... H01L 29/94; H01L 31/0312
(52) U.S. Cl. ........................ 257/328; 257/77; 257/342
(58) Field of Search ............................. 257/77, 328–9, 257/342; 438/105, 931

(56) References Cited

U.S. PATENT DOCUMENTS

| | | | | |
|---|---|---|---|---|
| 4,800,415 A | * | 1/1989 | Simmons et al. | 357/34 |
| 5,712,501 A | * | 1/1998 | Davies et al. | 257/335 |
| 5,977,564 A | * | 11/1999 | Kobayashi et al. | 257/77 |
| 6,097,063 A | * | 8/2000 | Fujihara | 257/339 |

FOREIGN PATENT DOCUMENTS

JP 10-308510 11/1998

OTHER PUBLICATIONS

S. Wolf and R. N. Tauber, "Silicon Processing for the VLSI Era", vol. 3—The Submicron MOSFET, Lattice Press, Sunset Beach, California; p. 136–138 ("4.1.1 Basics of MOSFET Operation"), 1995 (ISBN 0–961672–5–3).*
Frank Stern, "Self–Consistent Results for n–Type Si Inversion Layers", The Physical Review B, vol. 5, No. 12, pp. 4891–9 (Jun., 1972).*
T. Ando, A.B. Fowler and F. Stern, "Electronic Properties of Two–Dimensional Systems", in Reviews of Modern Physics, vol. 54, pp. 437–672 (1982).*
U.S. patent application Ser. No. 09/265,582, Miyajima, filed May 10, 1999.

* cited by examiner

Primary Examiner—Nathan J. Flynn
Assistant Examiner—Johannes Mondt
(74) Attorney, Agent, or Firm—Law Offices of David G. Posz

(57) ABSTRACT

In an accumulation mode MOSFET, a surface channel layer is disposed on a p$^-$ type base region between an n$^+$ type source region and an n$^-$ type epi layer. The surface channel layer is composed of an n type channel layer formed on the p$^-$ type base region and a p type channel layer formed on the n type channel layer. A gate insulating film is formed on the p type channel layer. A channel is formed in the n type channel layer. Accordingly, channel mobility can be improved and on-resistance can be reduced without being affected by a state of an interface between the gate insulating film and the surface channel layer.

10 Claims, 7 Drawing Sheets

SILICON CARBIDE SEMICONDUCTOR DEVICE AND METHOD FOR MANUFACTURING THE SAME

CROSS REFERENCE TO RELATED APPLICATION

This application is based upon and claims the benefit of Japanese Patent Application No. 11-267529 filed on Sep. 21, 1999, the contents of which are incorporated herein by reference.

BACKGROUND OF THE INVENTION

1. Field of the Invention

This invention relates to silicon carbide semiconductor devices, especially to insulation gate type field effect transistors such as a high-power vertical power MOSFET, and a method for manufacturing the same.

2. Description of the Related Art

Figure 7:
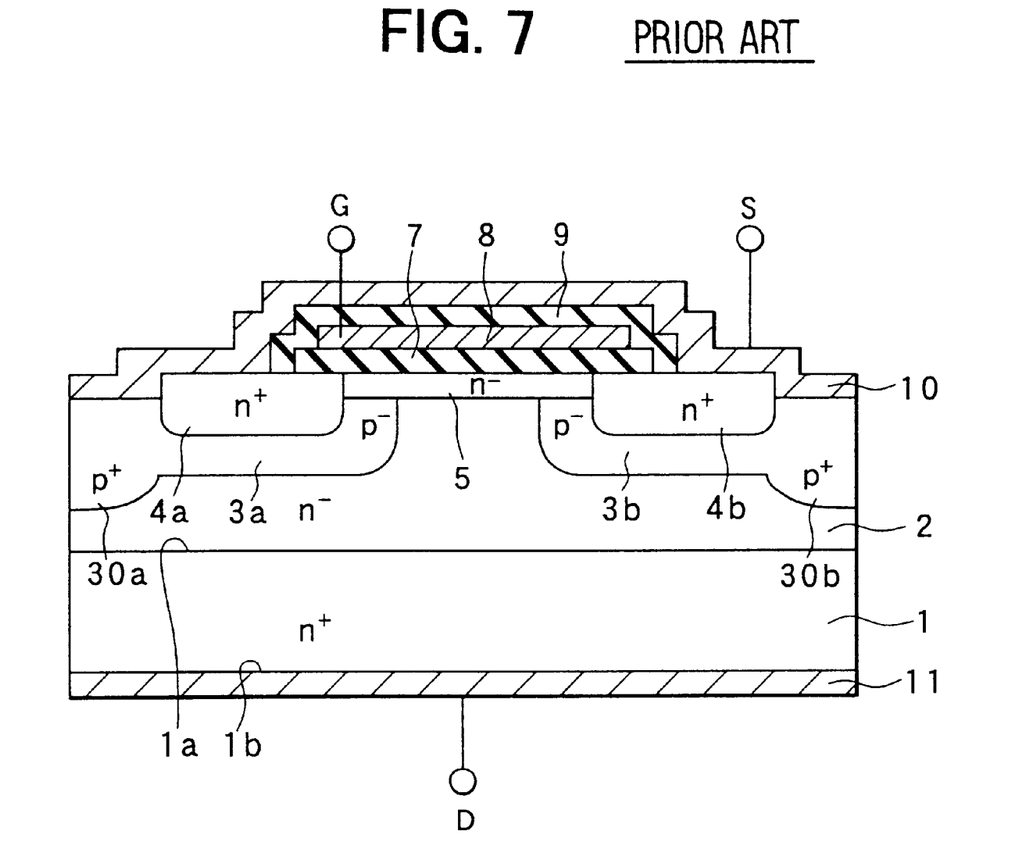
FIG. 7 is a cross-sectional view showing a conventional MOSFET.

JP-A-10-308510 discloses a planar type MOSFET shown in FIG. 7. Referring to FIG. 7, the MOSFET includes an $n^+$ type silicon carbide (SiC) semiconductor substrate ($n^+$ type substrate) 1 having an upper surface as a main surface 1a and a lower surface as a back surface 1b at an opposite side of the main surface 1a. An $n^-$ type silicon carbide epitaxial layer ($n^-$ type epi layer) 2 having a dopant concentration lower than that of the substrate 1 is disposed on the main surface 1a of the substrate 1.

Base regions formed by $p^-$ type silicon carbide ($p^-$ type base regions) 3a, 3b are provided in predetermined surface portions of the $n^-$ type epi layer 2 separate from each other. An $n^+$ type source region 4a is provided in a predetermined surface portion of the $p^-$ type base region 3a, which is shallower than the $p^-$ type base region 3a. An $n^+$ type source region 4b is provided in a predetermined surface portion of the $p^-$ type base region 3b, which is shallower than the $p^-$ type base region 3b.

An $n^-$ type SiC layer 5 extends in surface portions of the $n^-$ type layer 2 and the $p^-$ type base regions 3a, 3b, between the $n^+$ type source regions 4a and 4b. That is, the $n^-$ type SiC layer 5 extends in the p type base regions 3a, 3b to connect the source regions 4a, 4b and the epi layer 2. The $n^-$ type SiC layer 5 is an epitaxial layer formed through epitaxial growth and having a crystal structure of 4H, 6H, or 3C. The epitaxial layer can have a specific crystal structure regardless of the crystal structure of the underlying substrate. The $n^-$ type SiC layer 5 works as a channel layer at a surface of a device when the device is operated, and therefore, hereinafter it is referred to as a surface channel layer 5.

The dopant concentration of the surface channel layer 5 is in a range of $1\times10^{15}$ $cm^{-3}$ to $1\times10^{17}$ $cm^{-3}$, which is generally lower than those of the $n^-$ type epi layer 2 and the $p^-$ type base regions 3a, 3b, thereby lessening the on-resistance.

A gate insulating film (silicon oxide film) 7 is formed on the upper surfaces of the surface channel layer 5 and the $n^+$ type source regions 4a, 4b, and a gate electrode 8 is formed on the gate insulating film 7. The gate electrode 8 is covered with an insulating film 9 composed of an LTO (Low Temperature Oxide) film. A source electrode 10 is formed on the insulating film 9 and contacts the $n^+$ type source regions 4a, 4b and the $p^-$ type base region 3a, 3b. A drain electrode 11 is formed. on the back surface 1b of the substrate 1.

The semiconductor device described above can operate as an accumulation mode device without forming an inversion layer. Therefore, the channel mobility can be increased and the on-resistance can be reduced in comparison to an inversion mode MOSFET requiring an inversion layer. Thus, the accumulation mode MOSFET can reduce the on-resistance; however, there is a need to further decrease the on-resistance.

SUMMARY OF THE INVENTION

The present invention has been made in view of the above limitation. An object of the present invention is to reduce an on-resistance of an accumulation mode MOSFET.

An on-resistance of a MOS structure includes a channel resistance that is determined by a channel mobility and a carrier concentration of a channel region. The carrier concentration is determined by a doping concentration of an accumulation channel portion and a gate voltage. The channel mobility is determined by crystallinity of the channel region, and the like. Factors for increasing the on-resistance have been studied in view of the channel mobility.

In the conventional MOSFET, the channel region is formed in the surface portion of the surface channel layer 5, specifically at the interface between the surface channel layer 5 and the gate insulating film 7. The channel mobility is therefore affected by the interface state even in the accumulation mode MOSFET. It is assumed that the channel mobility is reduced due to roughness or defects produced by residue carbon at the MOS interface so that the on-resistance is increased.

Therefore, to achieve the above object, a silicon carbide semiconductor device according to the present invention has a surface channel layer that is composed of a first channel layer of a first conductivity type contacting a base region and a semiconductor layer, and a second channel layer of a second conductivity type disposed on the first channel layer. A gate insulating film is disposed on the second channel layer.

In this MOSFET, when an electric potential of a gate electrode is approximately zero, the surface channel layer can be set at a pinch-off state by a depletion layer extending from the second channel layer and a depletion layer extending from the base region. A channel can be formed in the first channel layer underlying the second channel layer without being affected by a state of an interface (MOS interface) between the surface channel layer and the gate insulating film. As a result, the channel mobility is improved and the on-resistance is reduced sufficiently.

The second channel layer should have a carrier concentration and a thickness that are determined such that the channel is formed in the first channel layer before a triangle potential is formed at the interface between the second channel layer and the gate insulating film. The second channel layer can be formed by ion-implanting second conductivity type impurities into the first channel layer or by epitaxial growth.

BRIEF DESCRIPTION OF THE DRAWINGS

Other objects and features of the present invention will become more readily apparent from a better understanding of the preferred embodiment described below with reference to the following drawings, in which.

DETAILED DESCRIPTION OF THE PREFERRED EMBODIMENT

In the embodiment, the present invention is applied to a normally off and n-channel planar type MOSFET (vertical power MOSFET) that is suitably applied to an inverter or a rectifier of a vehicle alternator.

The structure of the MOSFET is explained with reference to FIG. 1 in which the same parts as those shown in FIG. 7 are denoted with the same reference numerals. Mainly different portions from those shown in FIG. 7 are explained below.

In the MOSFET shown in FIG. 7, the entire surface channel layer 5 is made of n type silicon carbide; however, in the MOSFET according to the present embodiment, the surface channel layer 5 is composed of an n type channel layer made of n type silicon carbide and a p type channel layer made of p type silicon carbide, and forms a PN junction therebetween. Specifically, the surface channel layer 5 has the following constitution.

The n type channel layer is composed of an n⁻ type portion 5a that has high resistance and is to be a channel region, and an n⁺ type portion 5b other than the portion 5a. The n⁻ type portion 5a is disposed in the surface portions of the p⁻ type base regions 3a, 3b, and the n⁻ type portion 5b is disposed in the surface portion of the n type epi layer 2, thereby connecting the source regions 4a, 4b and the n⁻ type epi layer 2.

The p type channel layer is epitaxially grown on the n type channel layer and exposed on the uppermost surface of the surface channel layer 5. The p type channel layer is composed of a p⁻ type epi portion 5c positioned on the n⁻ type portion 5a, and a p⁻ type epi portion 5c positioned on the n⁺ type portion 5b. Incidentally, in the n type channel layer, the portion 5b other than the portion 5a that is to be the channel region is formed to have lower resistance than that of the portion 5a. To achieve this, an ion-implantation method is adopted as described below. In this case, it should be noted that the epi portion 5d can be formed at not a p type but an n⁻ type by doping.

Meanwhile, on-resistance $R_{on}$ of the MOSFET is determined by contact resistance $R_{s-cont}$ between the source electrode 10 and the n⁺ type source regions 4a, 4b, internal resistance (drift resistance) $R_{source}$ of the n⁺ type source regions 4a, 4b, accumulation channel resistance $R_{channel}$ of the channel region formed in the surface channel layer 5, internal resistance (accumulation drift resistance) $R_{acc-drift}$ of the surface channel layer 5, JFET resistance $R_{JFET}$ of the JFET portion, internal resistance (drift resistance) $R_{drift}$ of the n⁻ type epi layer 2, internal resistance $R_{sub}$ of the n⁺ type substrate 1, and contact resistance $R_{d-cont}$ between the n⁺ type substrate 1 and the drain electrode 11. That is, the on-resistance $R_{on}$ is represented by the following formula (1):

$$R_{on}=R_{s-cont}+R_{source}+R_{channel}+R_{acc-drift}+R_{JFET}+R_{drift}+R_{sub}+R_{d-cont} \quad (1)$$

As to the internal resistance (accumulation drift resistance) $R_{acc-drift}$ of the surface channel layer 5 in this case, since the portion 5b other than the portion 5a to be the channel region in the n type channel layer is formed of an n⁺ type layer as described above, it is small as compared to the case where the portion 5b is formed of an n⁻ type layer. This results in decreased on-resistance $R_{on}$.

On the other hand, the accumulation channel resistance $R_{channel}$ is determined by the channel mobility and the carrier concentration of the channel region. The carrier concentration is determined by the doping concentration of the accumulation channel portion and the gate voltage. The channel mobility is maximum when it corresponds to a bulk mobility. In the conventional structure, since the channel mobility is reduced by the roughness and scattering caused by remaining defects and ionized impurities at the MOS interface, the channel mobility is smaller than the bulk mobility. As opposed to this, in the present embodiment, since the channel region is separated from the MOS interface, the channel mobility is almost equal to the bulk mobility.

Assuming that the gate voltage is constant, the higher the doping concentration is, the higher the carrier concentration is. While there is a trade-off relation between the doping concentration and the bulk mobility, in the conventional structure, the channel mobility is approximately 100 cm²/Vs when the doping concentration is $1\times10^6$ cm⁻³. As opposed to this, in the present embodiment, the channel mobility of approximately 200 cm²/Vs or more can be exhibited even when the doping concentration is $1\times10^{17}$ to $10^{18}$ cm⁻³.

Figure 1:
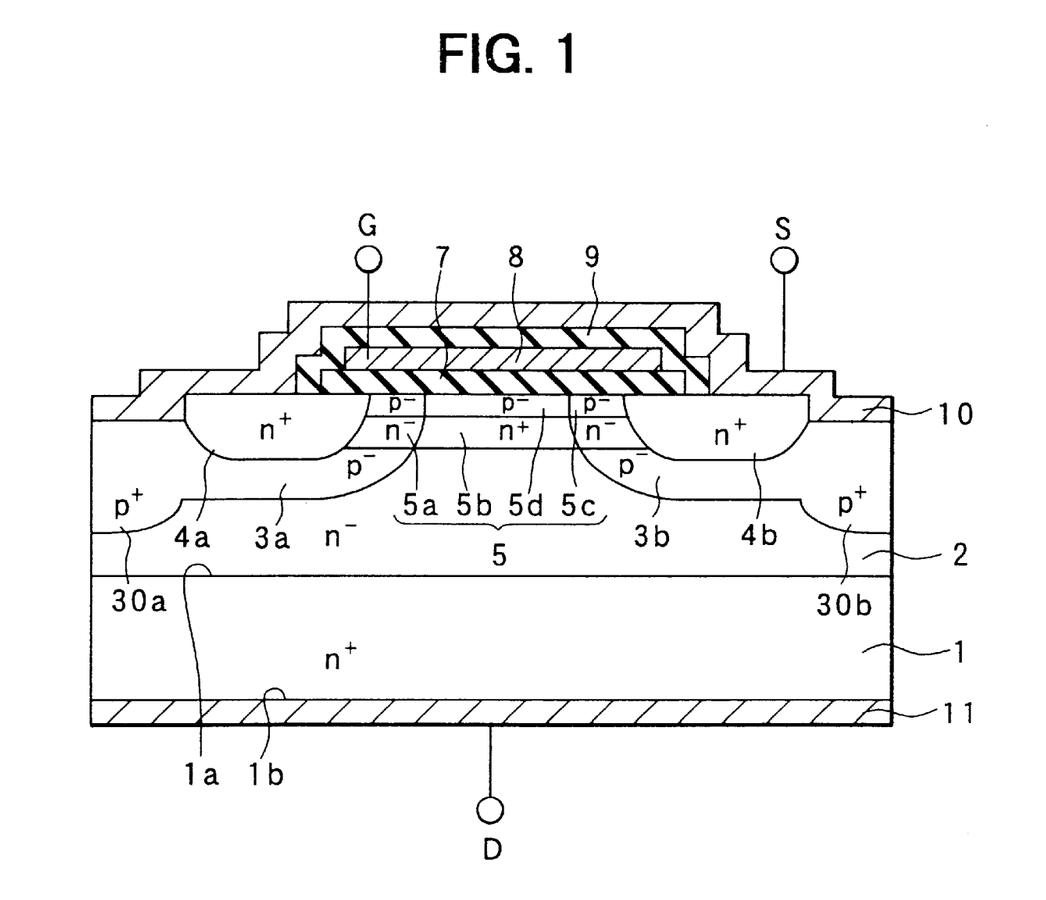
FIG. 1 is a cross-sectional view showing a MOSFET in a preferred embodiment according to the present invention.

Next, the manufacturing method of the MOSFET shown in FIG. 1 is explained with reference to FIGS. 2 to 4.

Figure 2A:
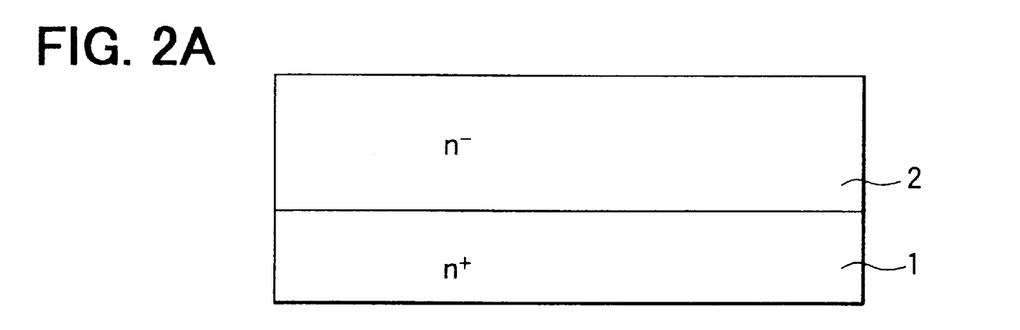
FIGS. 2A to 2C, 3A to 3C, and 4A to 4C are cross-sectional views showing a method for manufacturing the MOSFET shown in FIG. 1 in a step-wise manner.

[Step shown in FIG. 2A]

First, an n type 4H, 6H, 3C, or 15R-SiC substrate is prepared as the n⁺ type substrate 1. The n⁺ type substrate 1 is 400 μm in thickness, and has the main surface 1a corresponding to a (0001) Si-face or a (11$\bar{2}$0) a-face. The n⁻ type epi layer 2 is epitaxially grown on the main surface 1a of the substrate 1 to have a thickness of 5 μm. In the present embodiment, the n⁻ type epi layer 2 has the same crystal structure as that of the underlying substrate 1, and is an n-type 4H, 6H, 3C, or 15R-SiC layer.

Figure 2B:
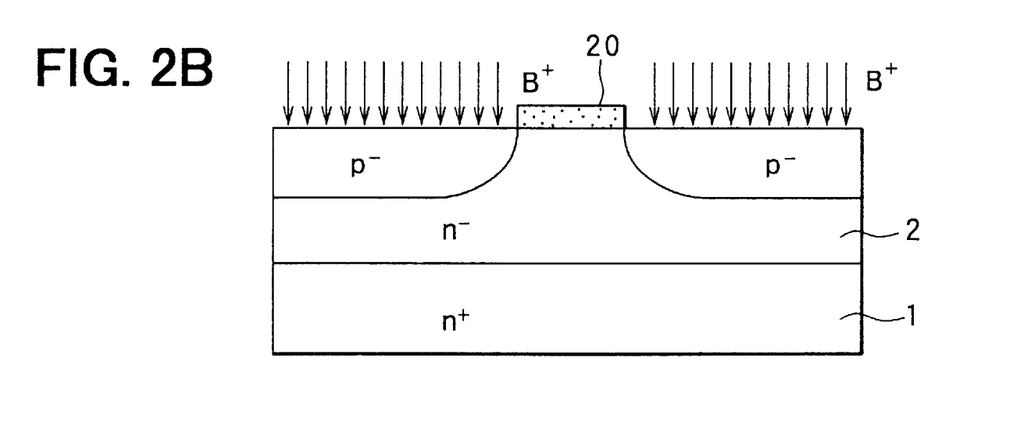

[Step shown in FIG. 2B]

An LTO film 20 is disposed on a specific region of the n⁻ type epi layer 2, and B⁺ (or aluminum) is ion-implanted into the n⁻ type epi layer 2 through the LTO film 20 as a mask to form the p⁻ type base regions 3a, 3b. As the ion implantation conditions, the temperature is 700° C. and the dose is $1\times10^{16}$ cm⁻².

Figure 2C:
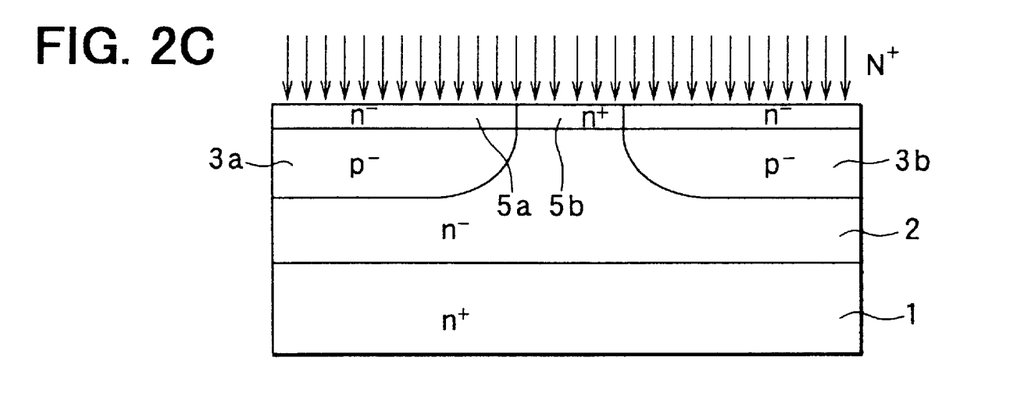

[Step shown in FIG. 2C]

After the LTO film 20 is removed, N⁺ is ion-implanted from the upper surface of the substrate 1 into the surface portions of the n⁻ type epi layer 2 and the p⁻ type base regions 3a, 3b to form the n type channel layer of the surface channel layer 5. As the ion implantation conditions, the temperature is 700° C. and the dose is $1\times10^{16}$ cm⁻². Accordingly, the n type channel layer has the n⁻ type portion 5a at the surface portions of the p⁻ type base regions 3a, 3b as a result of compensation, and the n⁺ type portion 5b at the surface portion of the n⁻ type epi layer 2. The impurity concentration of the n⁻ type portion 5a is lower than that of the n⁺ type portion 5b.

Figure 3A:
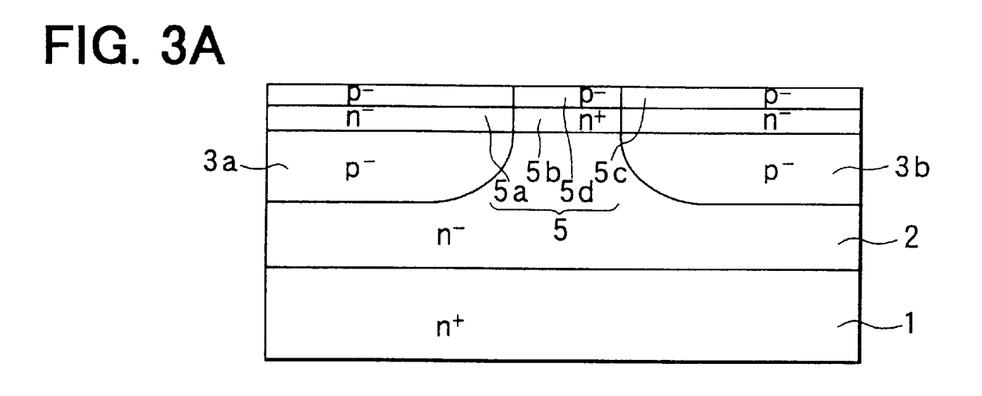

[Step shown in FIG. 3A]

Successively, the p type channel layer made of p type silicon carbide is epitaxially grown on the n type channel layer. Accordingly, the PN junction is provided between the n type channel layer and the p type channel layer.

Since the uppermost surface of the p type channel layer affects the gate voltage significantly, the thickness of the p type channel layer should be controlled to be approximately 0.1 μm at most, which is reduced as thin as possible. The thickness of the p type channel layer is preferably less than approximately 50 nm, and more preferably less than approximately 10 nm.

On the other hand, the doping concentration of the p type channel layer is in trade-off relation to the thickness of the p type channel layer. The doping concentration is preferably controlled to be approximately $1 \times 10^{17}$ cm$^{-3}$ when the thickness is approximately 0.1 μm. The doping concentration can be controlled to be approximately $1 \times 10^{18}$ cm$^{-3}$ or more when the thickness is smaller than approximately 10 nm.

As described above, the surface channel layer 5 is formed at the steps shown in FIGS. 2C and 3A. Here, the thickness of the surface channel layer 5 is determined based on the following formula (2) to make the MOSFET normally off type.

First, the condition for bringing the conventional MOSFET shown in FIG. 7 into the normally off type is explained. To make the MOSFET shown in FIG. 7 normally off type, when the gate voltage is not applied, a depletion layer extending in the n⁻ type layer needs to have a barrier height (width) sufficient for preventing electrical conduction. This condition is represented by the following formula (2):

$$Tepi = \sqrt{\frac{2\varepsilon s}{q} \cdot \frac{N_D + N_A}{N_D N_A} \cdot V_{built}} + \sqrt{\frac{2\varepsilon s}{q} \cdot \frac{1}{N_D} \left( \phi \text{ms} - \frac{Q_s + Q_{fc} + Q_i + Q_{ss}}{C_{ox}} \right)} \quad (2)$$

where Tepi is the width of the depletion layer extending in the n⁻ type layer, φms is a work function difference (electron energy difference) between metal and semiconductor, $Q_s$ is space change in the gate oxide (SiO$_2$) film 7, $Q_{fc}$ is fixed charge at the interface (SiO$_2$/SiC interface) between the gate oxide. film and the n⁻ type layer 5, $Q_i$ is a movable ion amount in the gate oxide film, $Q_{ss}$ is surface charge at the SiO$_2$/SiC interface, and $C_{ox}$ is a capacity of the gate insulating film 7.

The first term on the right side of the formula (2) represents an extending width of the depletion layer produced by built-in voltage $V_{built}$ of the PN junction formed between the surface channel layer 5 and the p⁻ type base regions 3a, 3b, i.e., an extending width of the depletion layer extending from the p type base regions 3a, 3b into the surface channel layer 5.

The second term represents an extending width of the depletion layer produced by the charge in the gate insulating film 7 and φms, i.e., an extending width of the depletion layer extending from the gate insulating film 7 into the surface channel layer 5. Therefore, when the sum of the extending width of the depletion layer extending from the p⁻ type base regions 3a, 3b and the extending width of the depletion layer extending from the gate insulating film 7 is equal to or larger than the thickness of the surface channel layer 5, the MOSFET becomes the normally off type. The surface channel layer 5 is formed by the ion implantation conditions to comply with this condition.

Then, in the present embodiment, the p type channel layer composed of the p type portions 5c, 5d is formed at the uppermost surface side of the surface channel layer 5 to form the PN junction with the n type channel layer. Because of this, in the formula (2), the depletion layer extends from the uppermost surface side as well by the built-in voltage $V_{built}$, so that entire width of the depletion layer is increases as compared to the conventional MOSFET. Therefore, the n⁻ type portion 5a can be thickened or have a higher doping concentration.

In the normally off type MOSFET described above, when any voltage cannot be applied to the gate electrode due to a device failure or the like, no current flows in the MOSFET. Therefore, high reliability can be secured as compared to a normally on type MOSFET. Further, as shown in FIG. 1, the p⁻ type base regions 3a, 3b contact the source electrode 10 to be a ground state. Because of this, the surface channel layer 5 can be brought into a pinch-off state by utilizing the built-in voltage $V_{built}$ of the PN junction between the surface channel layer 5 and the p⁻ type base regions 3a, 3b.

As opposed to this, when the p⁻ type base regions 3a, 3b are set at a floating state without being grounded, because the depletion layer cannot be extended from the p⁻ type base regions 3a, 3b by the built-in voltage $V_{built}$, the surface channel layer 5 cannot be brought into the pinch-off state by the built in voltage $V_{built}$. In the present embodiment, although the p type base regions 3a, 3b are formed with a low impurity concentration, the impurity concentration may be increased to increase the built-in voltage $V_{built}$.

Incidentally, the p type portions 5c, 5d provided at the uppermost surface side of the channel portion are not set at the ground state directly, but are affected by the electric potential of the gate electrode via the gate oxide film. Therefore, the depletion layer can be formed. Some device structures. can make it possible to join the p type portions 5c, 5d with the source or drain electrode. In this case, more stable operation can be performed.

Figure 3B:
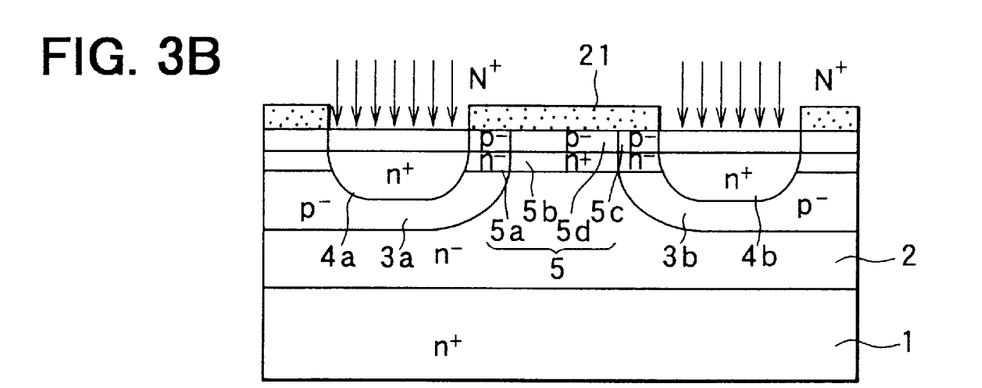
Figure 3C:
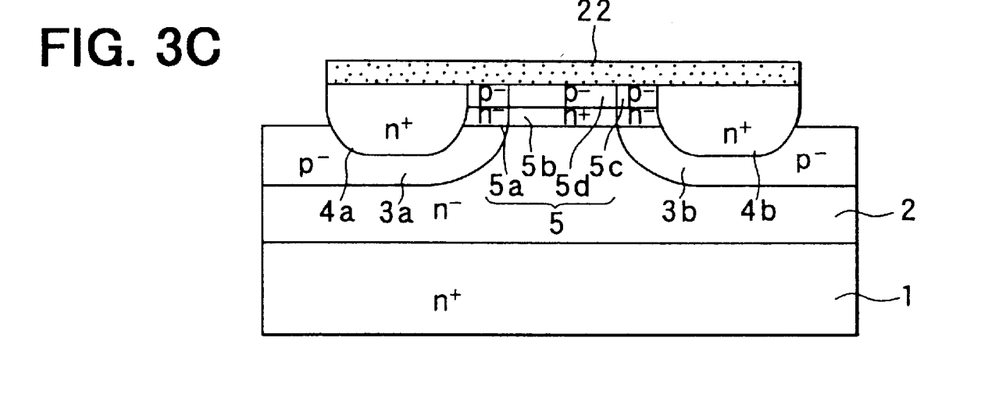

Then, the following steps are performed after the surface channel layer 5 is formed.
[Step shown in FIG. 3B]

An LTO film 21 is disposed on a specific region of the surface channel layer 5, and N⁺ is ion-implanted through the LTO film 21 as a mask to form the n⁺ type source regions 4a, 4b. As the ion implantation conditions, the temperature is 700° C. and the dose is $1 \times 10^{15}$ cm$^{-2}$.
[Step shown in FIG. 3C]

Figure 4A:
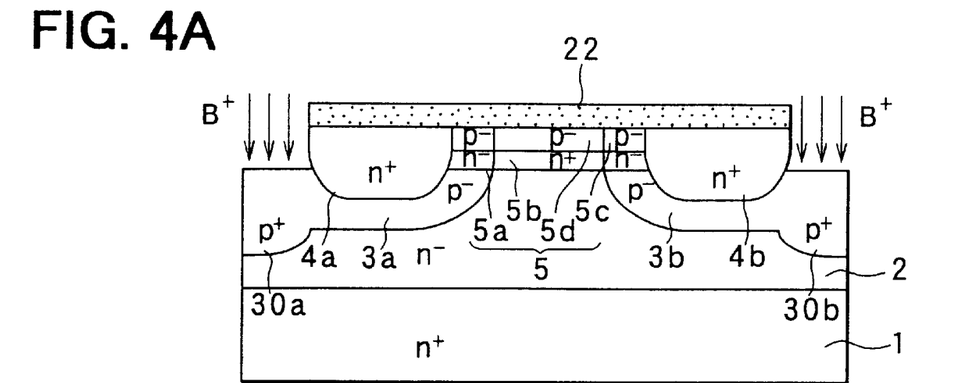
Figure 4B:
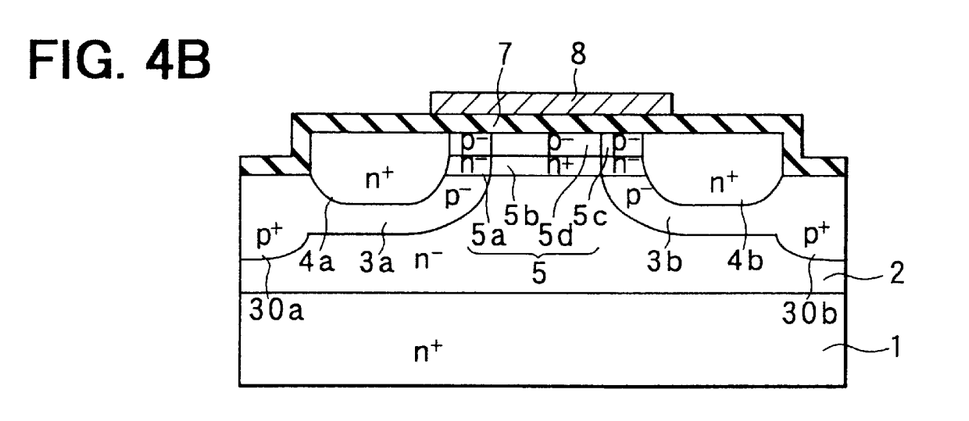
Figure 4C:
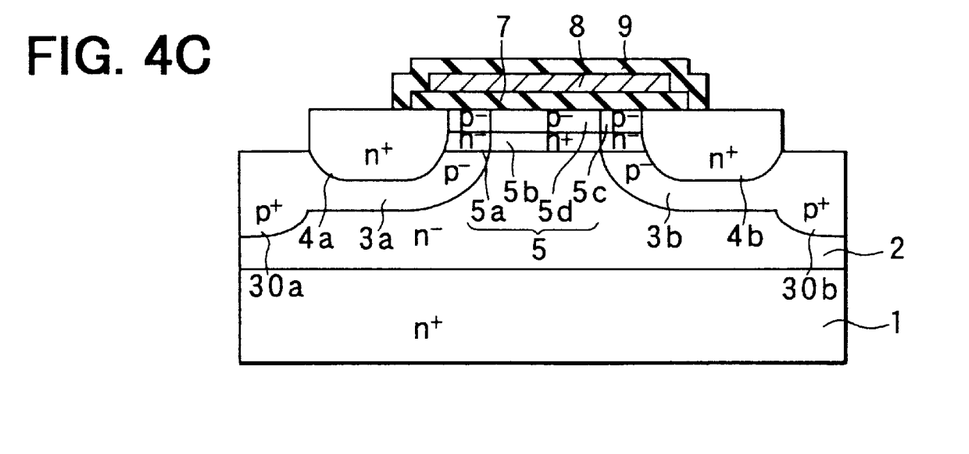

After the LTO film 21 is removed, another LTO film 22 is disposed on a specific region of the surface channel layer 5 by a photo-resist method, and the surface channel layer 5 extending on the p⁻ type base regions 3a, 3b is partially removed by RIE using the LTO film 22 as a mask.
[Step shown in FIG. 4A]

Then, B+ is ion-implanted through the LTO film 22 as a mask to form deep base layers 30a, 30b. Accordingly, the base regions 3a, 3b are partially thickened. The deep base layers 30a, 30b are formed not to overlap with the n⁺ type source regions 4a, 4b. In addition, the thick thickness portions of the p⁻ type base regions 3a, 3b where the deep base layers 30a, 30b are formed have an impurity concentration higher than that of the thin thickness portions of the p⁻ type base regions 3a, 3b where the deep base layers 30a, 30b are not formed.
[Step shown in FIG. 4B]

After the LTO film 22 is removed, the gate insulating film (gate oxide film) 7 is formed on the substrate by wet-oxidation. Ambient temperature at this step is 1080° C. After that, the polysilicon gate electrode 8 is deposited on the gate insulating film 7 by LPCVD at a temperature of 600° C.
[Step shown in FIG. 4C]

Successively, after unnecessary portions of the gate insulating film 7 are removed, the insulating film 9 made of LTO is formed to cover the remaining gate insulating film 7. The deposition temperature for the insulating film 9 is 425° C, and annealing is carried out at 1000° C. after the deposition.

Then, the source electrode 10 and the drain electrode 11 are deposited by metal-sputtering, respectively, at a room temperature. After those deposition, annealing is further carried out at 1000° C. Accordingly, the MOSFET shown in FIG. 1 is completed.

Next, the operation of the MOSFET is explained. The MOSFET in the present embodiment is a normally off type and operated at an accumulation mode. When no voltage is applied to the gate electrode 8, the surface channel layer 5 is entirely depleted due to the electrostatic potential difference between the p⁻ type base regions 3a, 3b and the surface channel layer 5, and the potential produced by the work function difference between the p type channel layer of the surface channel layer 5 and the gate electrode 8. Then, a specific voltage is applied to the gate electrode 8 to change the potential difference produced by the sum of the work function difference between the surface channel layer 5 and the gate electrode 8 and the externally applied voltage. Accordingly, the channel state is controlled.

Figure 5A:
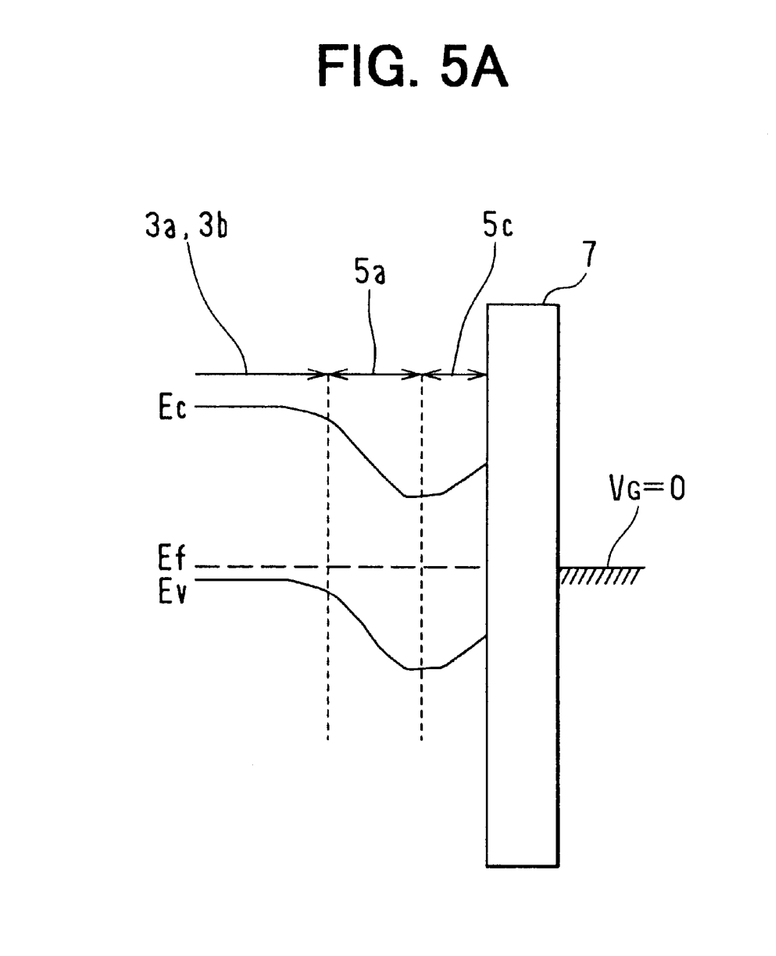
FIGS. 5A and 5B are energy band diagrams for explaining the operation of the MOSFET shown in FIG. 1.
Figure 5B:
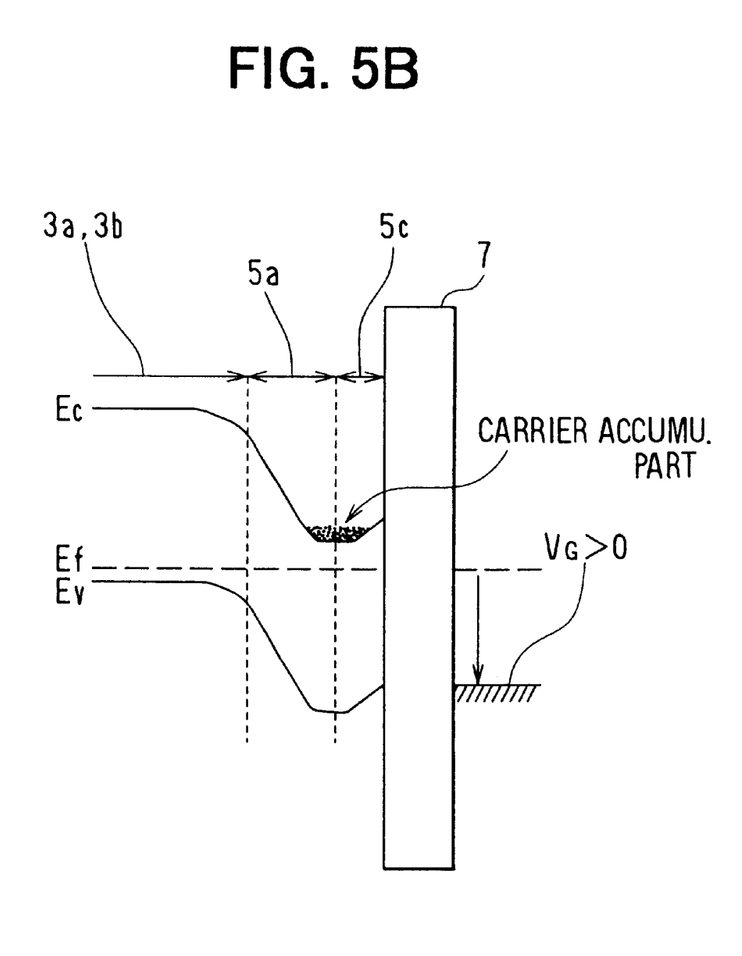

FIGS. 5A and 5B are energy bond diagrams showing an off state and on state of the MOSFET in the present embodiment. In a state where the off state is kept by the depletion layers formed from the p⁻ type base regions 3a, 3b and the p type epi portion 5c, a positive voltage is applied as the gate electrode $V_G$ to reduce the surface potential. Accordingly, an accumulation channel is formed in the n type channel layer of the surface channel layer 5.

Thus, the accumulation type channel is induced in the surface channel layer 5 by applying the positive voltage to the gate electrode 8, and carriers flow between the source electrode 10 and the drain electrode 11. As understood from FIG. 5B, accumulated carriers exist at a portion apart from the MOS interface, and current flows in that portion. Therefore, high mobility can be realized regardless of the interface (MOS interface) state between the surface channel layer 5 and the gate insulating film 7.

Figure 6A:
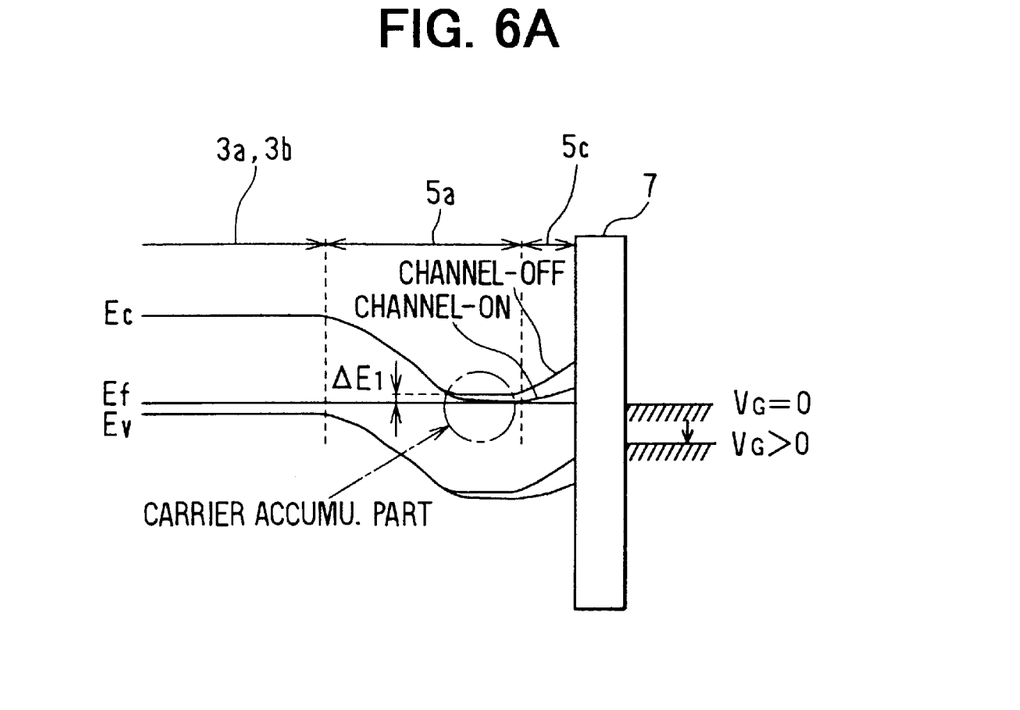
FIGS. 6A and 6B are energy band diagrams for explaining a relation between a concentration of a p type channel layer and the operation of the MOSFET.
Figure 6B:
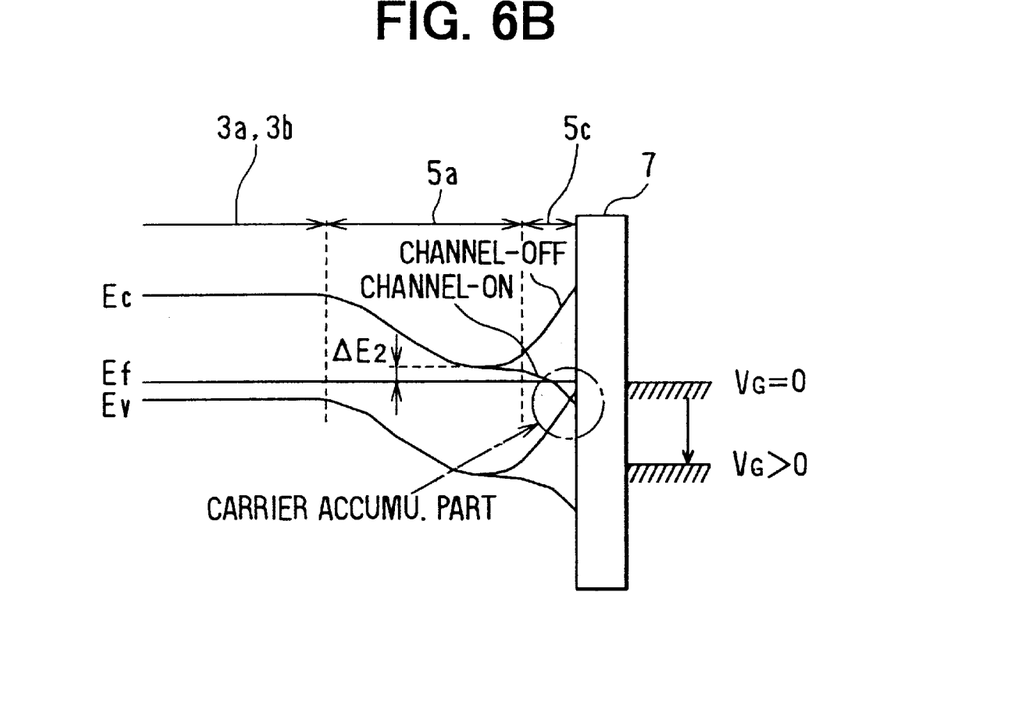

Further, because the MOSFET of the present embodiment works as described above, the doping concentration of the p type channel layer is defined as follows. FIGS. 6A and 6B are energy band diagrams respectively showing cases where the doping concentration of the p type channel layer is low and is high.

First, when the doping concentration of the p type channel layer is low as shown in FIG. 6A, since the built-in potential difference between the p type channel layer and the n type channel layer is small, energy difference ΔE1 between the Fermi level and the conduction band produced at the channel-off state is small. Therefore, the energy difference ΔE1 can be made equal to the activation energy of impurities in the n type SiC by small gate electrode $V_G$, and accordingly, carriers (electrons in this case) can be accumulated in the n type channel layer portion.

On the other hand, when the doping concentration is high as shown in FIG. 6B, since the built-in potential difference is large, energy difference ΔE2 is also large. The large energy difference ΔE2 cannot be made equal to the activation energy of impurities even when the gate voltage $V_G$ is increased.

Here, electron density n in the MOSFET channel region is represented by the following formula (3);

$$n \propto \exp(-\Delta E/kT) \quad (3)$$

As understood from the above formula, as the energy difference ΔE is increased, electrons (electron density) accumulated in the channel region are reduced. Therefore, the p type channel layer becomes an inverted state before the n type channel layer becomes the on state, and the channel is formed at the surface while forming so-called triangle potential. To the contrary, in the MOSFET of the present embodiment, the channel region is formed in the n type channel layer before the triangle potential is provided.

Considering the above points, it is necessary that the energy difference ΔE produced by the built-in potential difference between the p type channel layer and the n type channel layer is made almost equal to the activation energy of impurities when the gate electrode is applied. The doping concentration of the p type channel layer should be determined to realize this condition. Incidentally, similar phenomenon occurs when the p type channel layer is thick. Therefore, when the p type channel layer is thick, the doping concentration of the p type channel layer needs to be decreased still further. If the p type channel layer is thinned, the doping concentration of the p type channel layer can be increased.

In the present embodiment, the n⁺ type portion 5b is formed in the surface portion of the n⁻ type epi layer 2 by ion implantation; however, it may be formed by epitaxial growth. Also, the second portion 5d of the second channel layer 5c, 5d may have an impurity concentration higher than that of the first portion 5c of the second channel layer 5c, 5d. While the present invention has been shown and described with reference to the foregoing preferred embodiment, it will be apparent to those skilled in the art that changes in form and detail may be made therein without departing from the scope of the invention as defined in the appended claims.

What is claimed is:

1. A silicon carbide semiconductor device comprising:
   a semiconductor substrate of a first conductivity type made of silicon carbide and having a first surface and a second surface;
   a semiconductor layer of the first conductivity type located on the first surface of the semiconductor substrate and made of silicon carbide having a resistance higher than that of the semiconductor substrate;
   a base region of a second conductivity type located in a surface portion of the semiconductor layer;
   a source region of the first conductivity type located in a surface portion of the base region;
   a surface channel layer located on the base region and connecting the source region and the semiconductor layer, the surface channel layer including a first channel layer of the first conductivity type contacting the base region and the semiconductor layer, and a second channel layer of the second conductivity type located on the first channel layer;
   a gate insulating film located on the second channel layer;
   a gate electrode located on the gate insulating film;
   a source electrode contacting the base region and the source region; and
   a drain electrode located on the second surface of the semiconductor substrate.

2. The silicon carbide semiconductor device of claim 1, wherein the first channel layer includes a first portion located on the base region, and a second portion located on the semiconductor layer, the second portion having an impurity concentration higher than that of the first portion.

3. The silicon carbide semiconductor device of claim 2, wherein the second channel layer includes a first portion located on the first portion of the first channel layer and a second portion located on the second portion of the channel layer, the second portion of the second channel layer having an impurity concentration higher than that of the first portion of the second channel layer.

4. The silicon carbide semiconductor device of claim 1, wherein the second channel layer includes a first portion located on the base region through the first channel layer and a second portion located on the semiconductor layer through the first channel layer, the second portion having an impurity concentration higher than that of the first portion.

5. The silicon carbide semiconductor device of claim 1, wherein, when the electric potential of the gate electrode is approximately zero, the surface channel layer is set at a pinch-off state by a depletion layer extending from the second channel layer and a depletion layer extending from the base region.

6. The silicon carbide semiconductor device of claim 1, wherein the thickness of the second channel layer is less than approximately 0.1 µm.

7. The silicon carbide semiconductor device of claim 6, wherein the thickness of the second channel layer is less than approximately 50 nm.

8. The silicon carbide semiconductor device of claim 1, wherein the first channel layer includes a first portion located on the base region, and a second portion located on the semiconductor layer, the second portion having an impurity concentration higher than that of the first portion, wherein a channel through which current flows is formed in the first channel layer in response to application of voltage to the gate electrode.

9. The silicon carbide semiconductor device of claim 1, wherein the semiconductor device is an accumulation MOSFET and, when the electric potential of the gate electrode is approximately zero, the surface channel layer is set at a pinch-off state by a depletion layer extending from the second channel layer and a depletion layer extending from the base region.

10. A silicon carbide semiconductor device comprising:

a semiconductor substrate of a first conductivity type made of silicon carbide and having a first surface and a second surface;

a semiconductor layer of the first conductivity type located on the first surface of the semiconductor substrate and made of silicon carbide having a resistance higher than that of the semiconductor substrate;

a base region of a second conductivity type located in a surface portion of the semiconductor layer;

a source region of the first conductivity type located in a surface portion of the base region;

a surface channel layer fabricated on the base region, wherein the surface channel layer connects the source region and the semiconductor layer, the surface channel layer including:

a first channel layer of the first conductivity type, wherein the first channel layer contacts the base region and the semiconductor layer; and a second channel layer of the second conductivity type, wherein the second channel layer is formed on the first channel layer;

a gate insulating film located on the second channel layer;

a gate electrode located on the gate insulating film;

a source electrode contacting the base region and the source region; and a drain electrode located on the second surface of the semiconductor substrate.

* * * * *